United States Patent
Hwang

(10) Patent No.: US 11,013,153 B2
(45) Date of Patent: May 18, 2021

(54) INVERTER AND METHOD OF CONTROLLING THE SAME

(71) Applicant: LSIS CO., LTD., Anyang-si (KR)

(72) Inventor: Soo-Yong Hwang, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 367 days.

(21) Appl. No.: 16/006,219

(22) Filed: Jun. 12, 2018

(65) Prior Publication Data

US 2019/0239396 A1 Aug. 1, 2019

(30) Foreign Application Priority Data

Jan. 30, 2018 (KR) .................. 10-2018-0011279

(51) Int. Cl.
*H05K 7/20* (2006.01)
*H02M 7/00* (2006.01)

(52) U.S. Cl.
CPC ........ *H05K 7/20945* (2013.01); *H02M 7/003* (2013.01); *H05K 7/209* (2013.01); *H05K 7/20909* (2013.01); *H05K 7/20918* (2013.01)

(58) Field of Classification Search
CPC ........... H05K 7/20945; H05K 7/20918; H05K 7/209; H05K 7/20909; H02M 7/003
USPC ....................................................... 361/695
See application file for complete search history.

(56) References Cited

U.S. PATENT DOCUMENTS

| | | | |
|---|---|---|---|
| 5,905,647 A * | 5/1999 | Shirai | H05K 7/20909 363/141 |
| 7,205,740 B1 | 4/2007 | Wei et al. | |
| 7,817,419 B2 | 10/2010 | Illerhaus | |
| 9,084,376 B2 | 7/2015 | Weiss | |
| 2010/0171400 A1* | 7/2010 | Hill | H05K 7/20618 312/236 |
| 2011/0199736 A1 | 8/2011 | Sawada et al. | |
| 2012/0262833 A1 | 10/2012 | Kishimoto et al. | |

(Continued)

FOREIGN PATENT DOCUMENTS

| | | |
|---|---|---|
| CN | 201478995 U | 5/2010 |
| CN | 101764510 A | 6/2010 |
| CN | 201813311 U | 4/2011 |

(Continued)

OTHER PUBLICATIONS

Japanese Office Action for related Japanese Application No. 2018-107996; action dated Dec. 11, 2018; (2 pages).

(Continued)

*Primary Examiner* — Anatoly Vortman
*Assistant Examiner* — Zhengfu J Feng
(74) *Attorney, Agent, or Firm* — K&L Gates LLP

(57) ABSTRACT

The present invention provides an inverter including: a middle frame in which a main circuit is disposed; an upper case disposed above the middle frame and configured to accommodate the main circuit; and a lower case disposed under the middle frame and having a first vent hole formed in one side surface thereof; a fan disposed at the other side surface of the lower case facing the first vent hole; a heat sink interposed between the first vent hole and the fan; an auxiliary housing disposed under the lower case, configured to accommodate an auxiliary circuit, and including a second vent hole in at least one side surface thereof; and a controller disposed in the main circuit of the auxiliary circuit.

12 Claims, 9 Drawing Sheets

(56) References Cited

U.S. PATENT DOCUMENTS

2015/0156919 A1\* 6/2015 Schroedl ............ H05K 7/20918
361/692

FOREIGN PATENT DOCUMENTS

| | | | |
|---|---|---|---|
| CN | 202798511 U | | 3/2013 |
| CN | 103269168 A | | 8/2013 |
| CN | 103269168 A | \* | 8/2013 |
| CN | 204316303 U | | 5/2015 |
| CN | 205160967 U | | 4/2016 |
| CN | 105703644 A | | 6/2016 |
| EP | 0854565 A2 | | 7/1998 |
| EP | 1610452 A2 | | 12/2005 |
| EP | 2879476 A1 | | 11/2013 |
| EP | 2843700 A2 | | 3/2015 |
| JP | 2005348533 A | | 12/2005 |
| JP | 2005348534 A | | 12/2005 |
| JP | 2012009636 A | | 1/2012 |
| JP | 2012060027 A | | 3/2012 |
| JP | 2013162052 A | | 8/2013 |
| JP | 2014045529 A | | 3/2014 |
| JP | 2015050929 A | | 3/2015 |
| JP | 2017131061 A | | 7/2017 |
| JP | 2017208384 A | | 11/2017 |
| KR | 20170004109 A | | 1/2017 |

OTHER PUBLICATIONS

European Search Report for related European Application No. 18174845.0; action dated Dec. 4, 2018; (7 pages).
Chinese Office Action for related Chinese Application No. 201810582946.1; action dated Aug. 26, 2020; (7 pages).

\* cited by examiner

[FIG. 1]
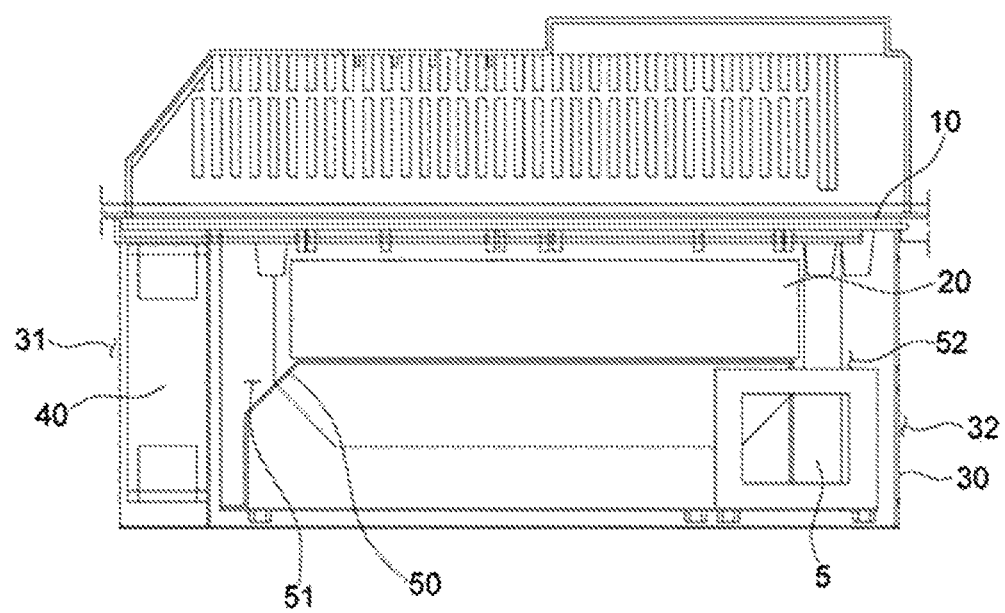
(Prior Art)

[FIG. 2]
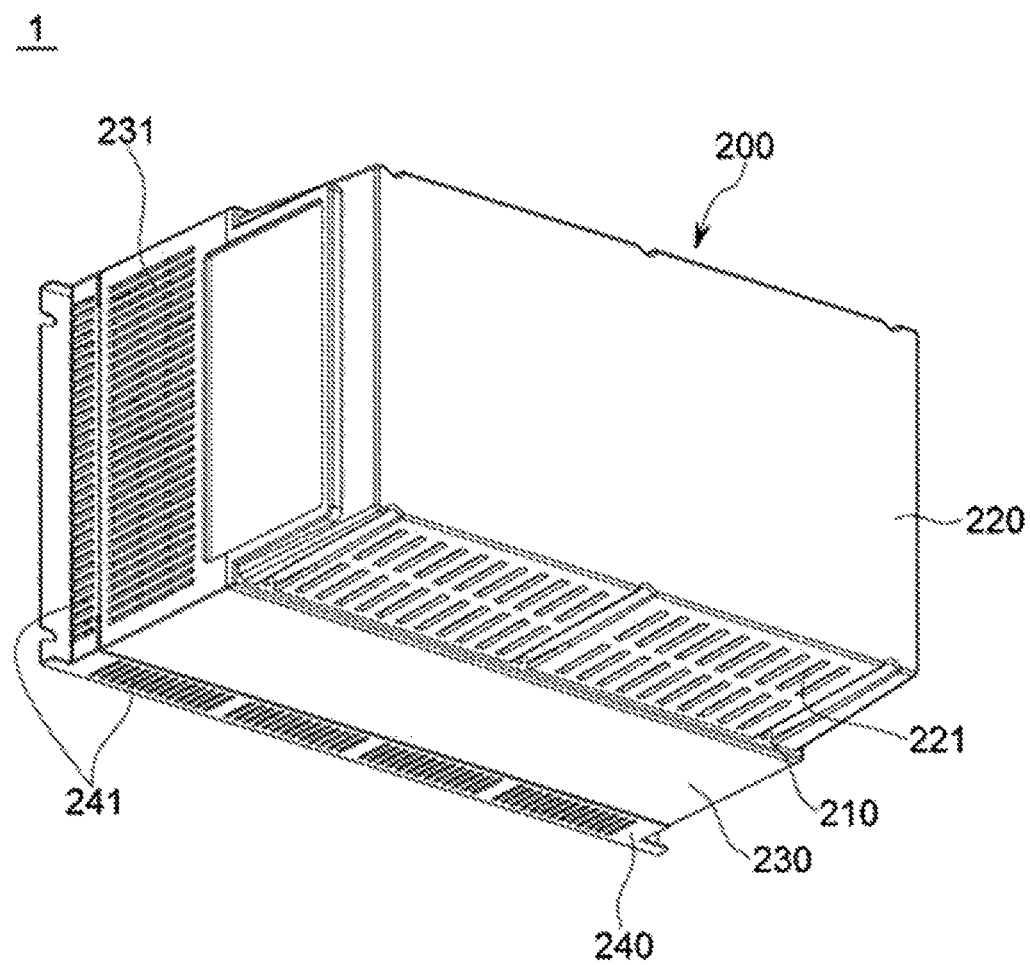

[FIG. 3]
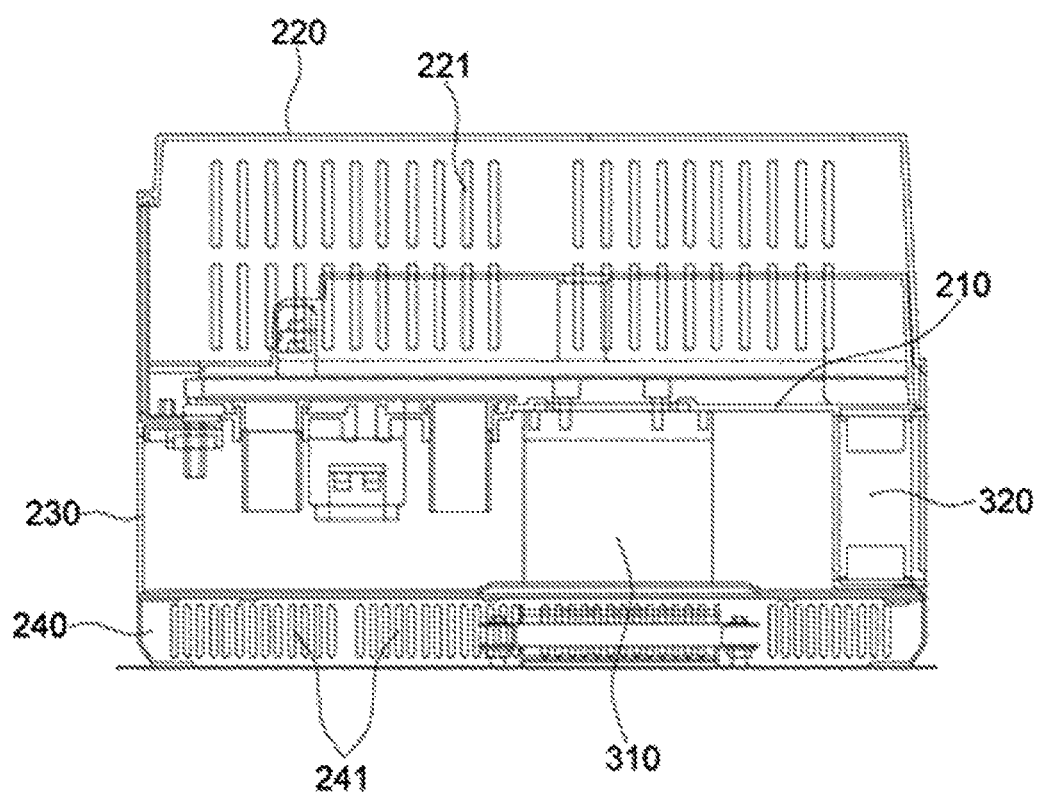

[FIG. 4]
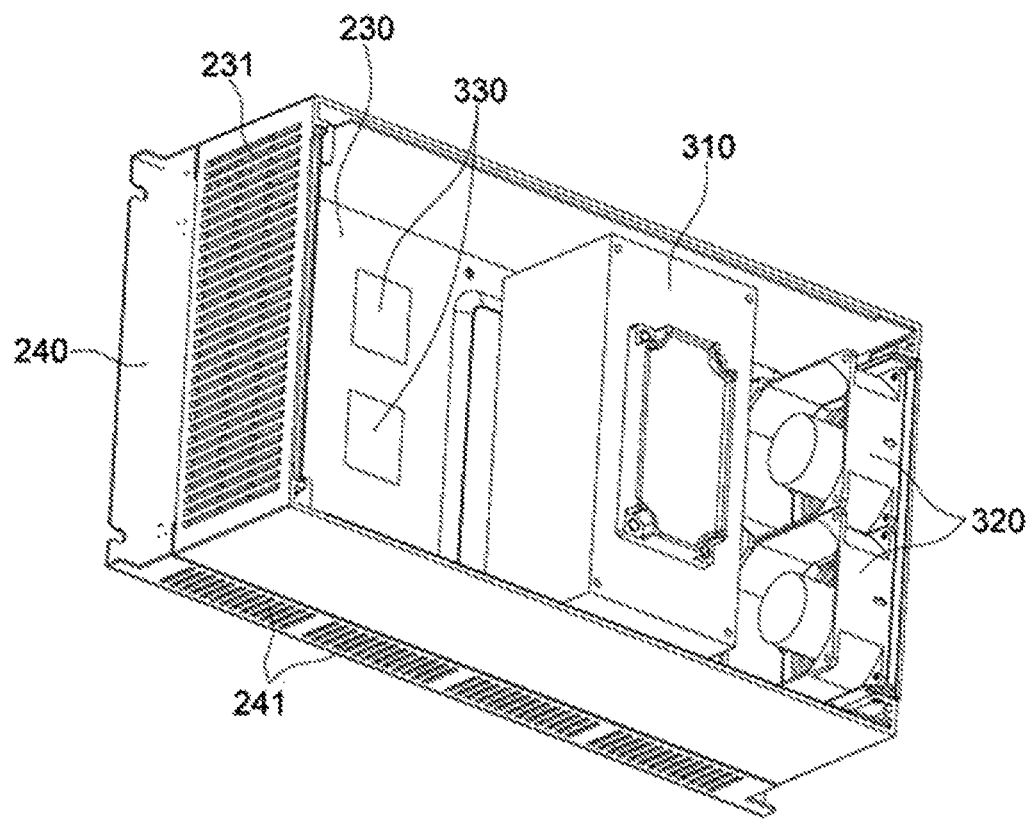

[FIG. 5]
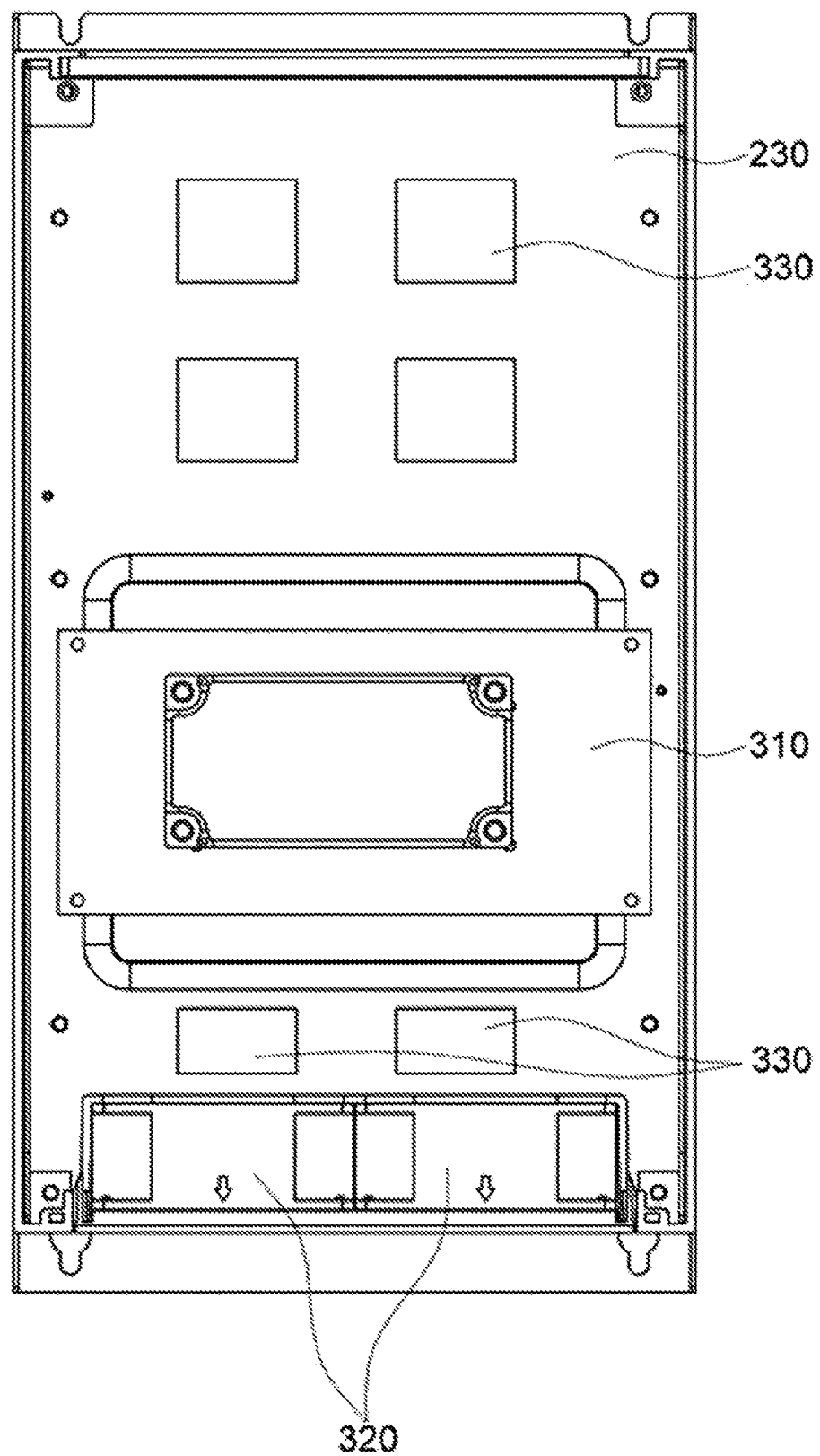

[FIG. 6]
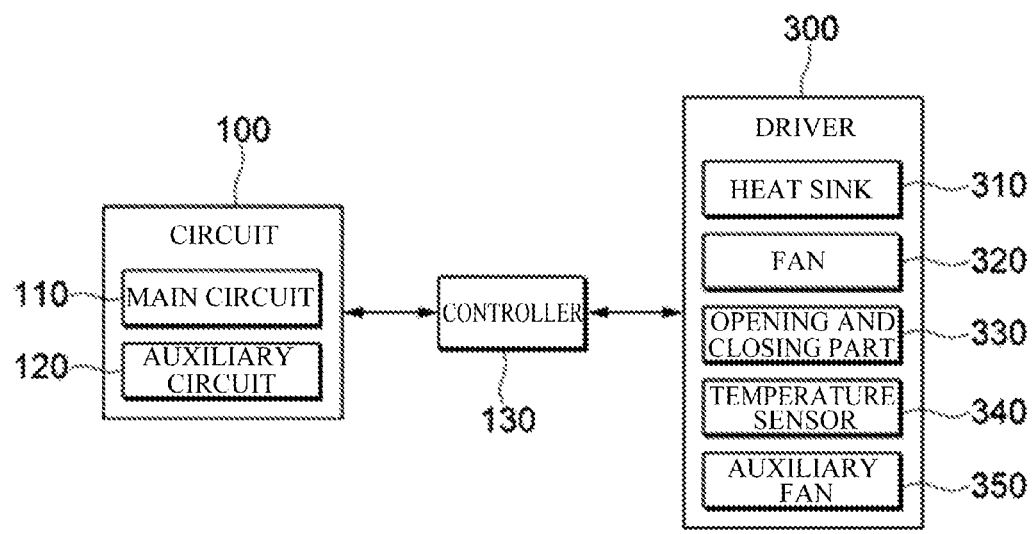

[FIG. 7]
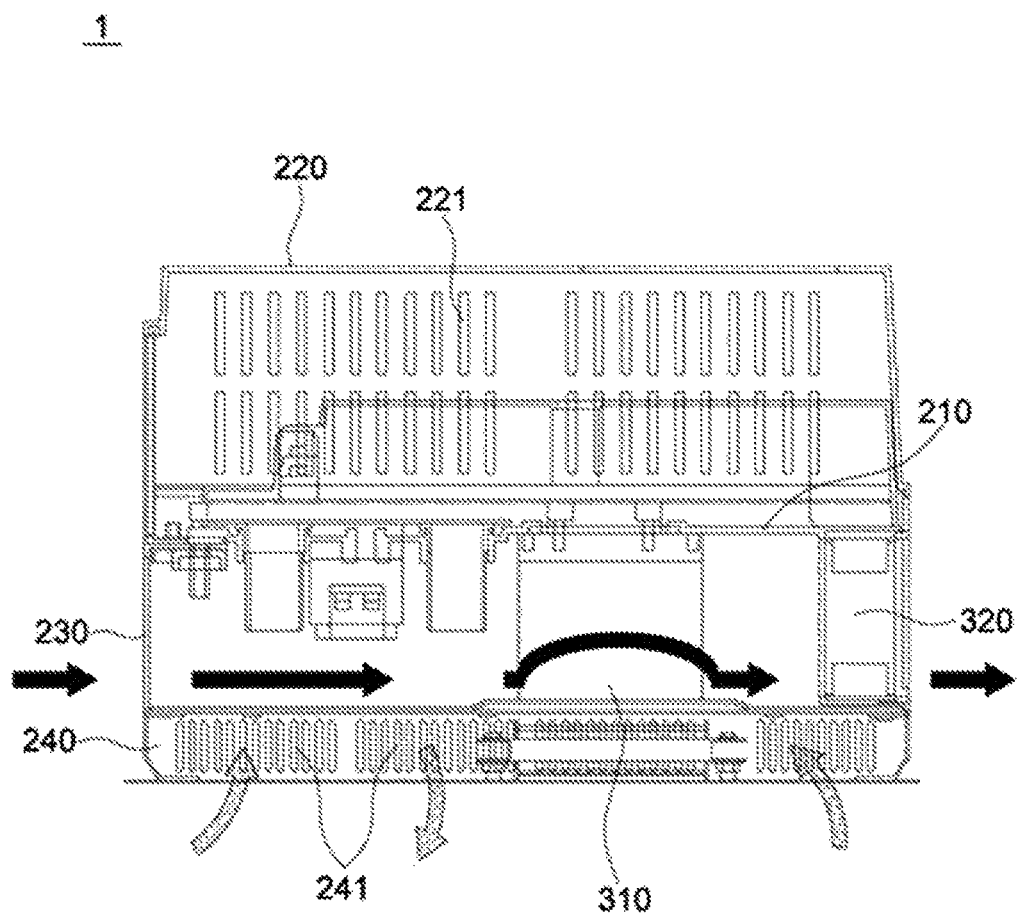

[FIG. 8]
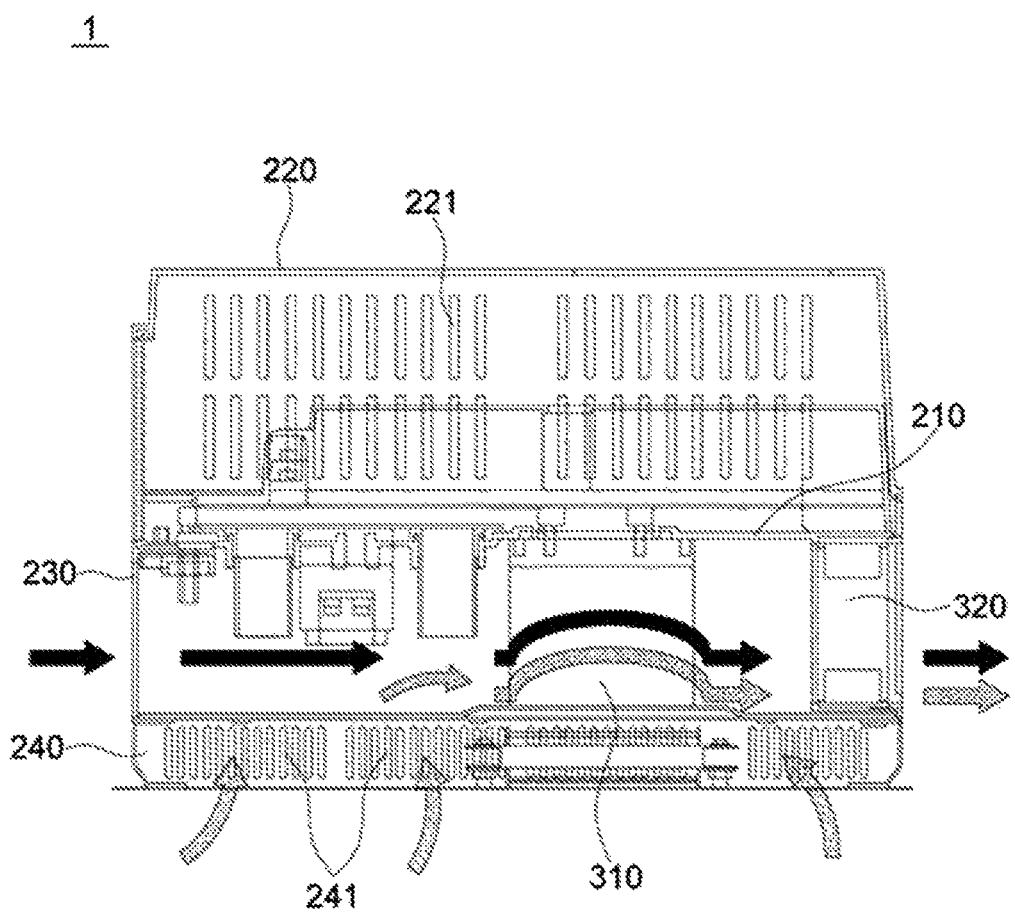

[FIG. 9]
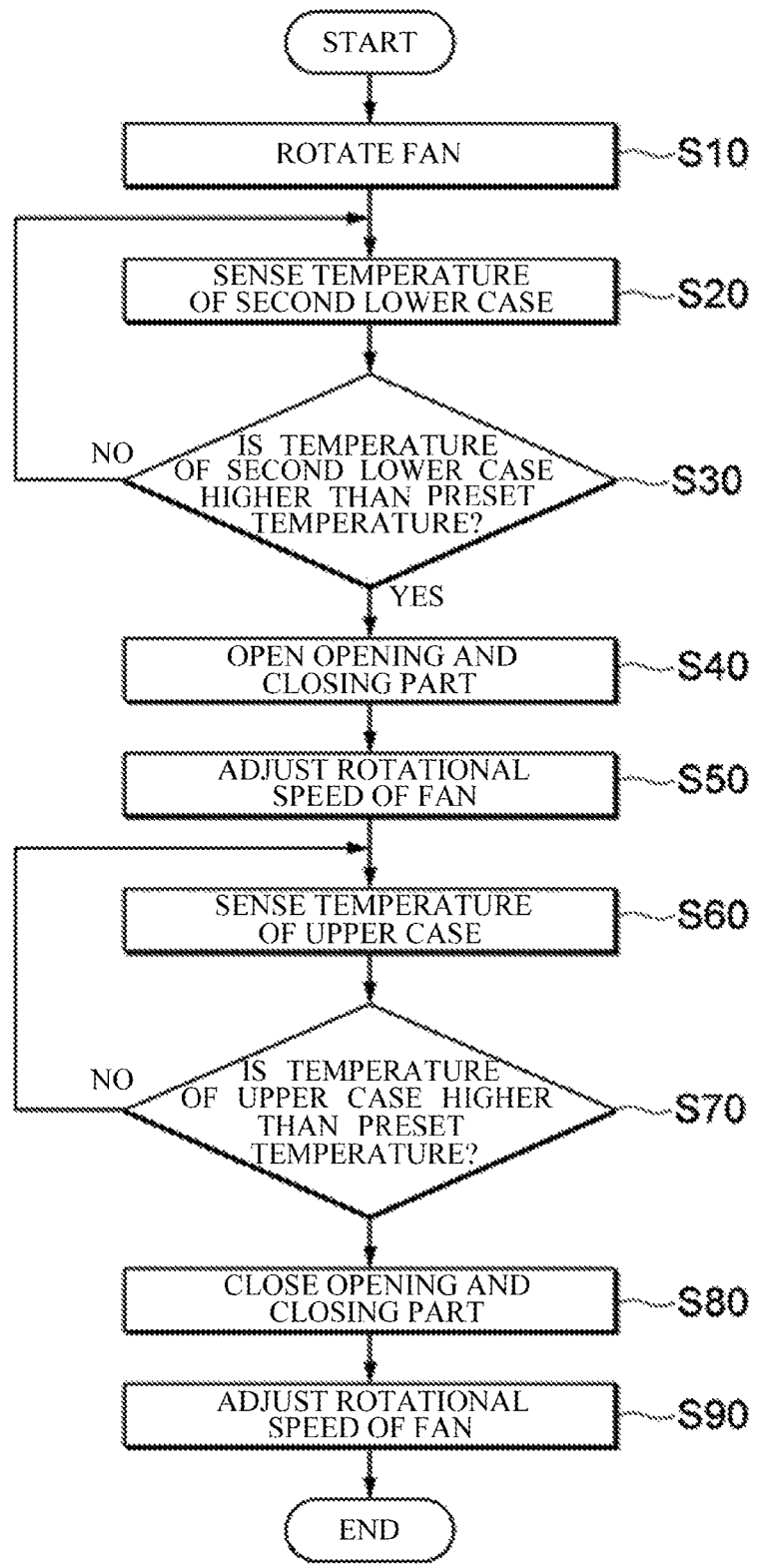

INVERTER AND METHOD OF CONTROLLING THE SAME

CROSS-REFERENCE TO RELATED APPLICATION

Pursuant to 35 U.S.C. § 119(a), this application claims the benefit of earlier filing date and right of priority to Korean Application No. 10-2018-0011279, filed on Jan. 30, 2018, the disclosure of which is incorporated herein by reference in its entirety.

BACKGROUND

1. Field of the Invention

The present invention relates to an inverter in which a cooling structure is improved.

2. Discussion of Related Art

An inverter is a unit configured to change direct current (DC) power into alternating current (AC) power, a converter is a unit configured to change AC power into DC power, and both of the units are generically referred to as inverters.

In any case, inverters are widely being used for driving domestic or industrial electronic devices or motors.

FIG. 1 is a side cross-sectional view illustrating a conventional inverter.

Referring to FIG. 1, in the conventional inverter, a heat sink 20 for dissipating heat generated by a circuit is disposed under a middle case 10 in which the circuit is disposed, and the heat sink 20 is accommodated in a lower case 30 coupled to a lower side of the middle case 10.

In addition, a main inlet hole 31 through which an external air is introduced may be formed in one side surface of the lower case 30, a main discharge hole 32 through which the introduced external air is discharged may be formed in the other side surface thereof, and the lower case 30 includes a fan 40 disposed adjacent to the main inlet hole 31 and configured to move air.

In addition, a differential current relay (DCR) 5, which is relatively not sensitive to foreign materials in the circuit, may be disposed in the lower case 30, and in this case, a space in the lower case 30 is divided into a first space and a second space by a partition 50, and the heat sink 20 and the DCR 5 are disposed in the first space and the second space, respectively.

An auxiliary inlet hole 51 through which air moved by the fan 40 is introduced is formed in the partition 50, and an auxiliary discharge hole 52 for discharging air through the main discharge hole 32 is formed in the partition 50.

That is, the conventional inverter has a structure in which air is forcibly introduced through one main inlet hole 31 formed in the lower case 30 by the fan 40, forcibly circulated in the first space and the second space formed in the lower case 30 by the partition 50, and discharged through one main discharge hole 32.

In such a structure of the conventional inverter, since the partition 50 has to be formed in consideration of a structure for an air flow in the second space, the structure may be complex and the utilization of a space may be reduced.

In addition, since the air forcibly circulated by the fan 40 is introduced through one main inlet hole 31, forcibly circulated in the first space and the second space, and discharged through one main discharge hole 32, a vortex is generated in the lower case 30 so that a heat dissipation effect may be reduced.

SUMMARY OF THE INVENTION

The present invention is directed to improving an air flow structure of a lower case of an inverter so as to improve driving efficiency and heat dissipation performance of a fan.

According to an aspect of the present invention, there is provided an inverter including: a main housing configured to accommodate a main circuit, and including a first vent hole formed in a lower end portion of one side surface thereof; a fan disposed on the other side surface of the main housing facing the first vent hole; a heat sink interposed between the first vent hole and the fan; an auxiliary housing disposed under the main housing, configured to accommodate an auxiliary circuit, and including a second vent hole formed in at least one side surface thereof; and a controller disposed in the main circuit or the auxiliary circuit.

The main housing may include: a middle frame in which the main circuit is disposed; an upper case disposed above the middle frame and configured to accommodate the main circuit; and a lower case disposed under the middle frame and having the first vent hole formed in one side surface thereof.

A plurality of first vent holes identical to the first vent hole may be formed in the one side surface of the lower case, and a plurality of second vent holes identical to the second vent hole may be formed in the at least one side surface of the auxiliary housing.

The second vent hole may be formed in each of side surfaces of the auxiliary housing.

The fan may rotate such that the first vent hole becomes an inlet through which external air is introduced.

The inverter may further include at least one opening and closing part interposed between the main housing and the auxiliary housing and configured to be opened so that the main housing communicates with the auxiliary housing.

The opening and closing part may be opened or closed by control of the controller or manually opened or closed.

The auxiliary housing may further include a temperature sensor configured to operate in conjunction with the controller, and the controller may open the opening and closing part when a temperature of an inside of the auxiliary housing measured by the temperature sensor is a preset temperature.

The controller may start to open the opening and closing part in a case in which the temperature of the inside of the auxiliary housing measured by the temperature sensor is higher than or equal to a first set temperature which is preset, completely open the opening and closing part in a case in which the temperature of the inside of the auxiliary housing measured by the temperature sensor is higher than or equal to a second set temperature which is preset, and control an opening rate of the opening and closing part according to an increase rate of temperature in a case in which the temperature of the inside of the auxiliary housing measured by the temperature sensor ranges from the first set temperature to the second set temperature.

The main housing may include: a middle frame in which the main circuit is disposed; an upper case disposed above the middle frame, configured to accommodate the main circuit, and including a temperature sensor configured to operate in conjunction with the controller; and a lower case disposed under the middle frame and having the first vent hole formed in one side surface thereof, wherein the controller may close the opening and closing part when a temperature of an inside of the upper case measured by the temperature sensor is a preset temperature.

The main housing may include: a middle frame in which the main circuit is disposed; an upper case disposed above the middle frame and configured to accommodate the main circuit; and a lower case having the first vent hole formed in one side surface thereof, disposed under the middle frame, and including a temperature sensor configured to operate in conjunction with the controller, wherein the controller may open the opening and closing part when a temperature of an inside of the lower case measured by the temperature sensor is a preset temperature or lower.

The opening and closing part may be interposed between the first vent hole and the heat sink or between the heat sink and the fan.

A differential current relay (DCR) may be disposed at a location, which corresponds to the heat sink, in the auxiliary housing.

The controller may open the opening and closing part when an output current of the circuit is a preset current value or more.

The controller may control a rotational speed of the fan according to an output current value of each of the circuit or an opening extent of the opening and closing part.

According to another aspect of the present invention, there is provided a method of controlling an inverter including: rotating a fan in a lower case, in which a heat sink is disposed, to dissipate heat; sensing a temperature of an inside of an auxiliary housing disposed under the lower case or a temperature of an auxiliary circuit disposed in the auxiliary housing; and opening an opening and closing part disposed on a bottom surface of the lower case or an upper surface of the auxiliary housing when the temperature of the inside of the auxiliary housing is higher than a preset temperature, or the temperature of the auxiliary circuit is higher than a preset temperature, or an output current of each of a main circuit and the auxiliary circuit is a preset current value or more.

The opening of the opening and closing part may include staring to open the opening and closing part when a measured temperature of the inside of the auxiliary housing or a measured temperature of the auxiliary circuit disposed in the auxiliary housing is higher than or equal to a first set temperature which is preset, completely opening the opening and closing part in a case in which the measured temperature of the inside of the auxiliary housing is higher than or equal to a second set temperature which is preset, and controlling an opening rate of the opening and closing part according to an increase rate of the temperature when the measured temperature ranges from the first set temperature and the second set temperature.

The opening of the opening and closing part may include closing a part or entirety of the opening and closing part when a temperature of an upper case disposed above the lower case and configured to accommodate the main circuit increases to a preset temperature or higher after the opening and closing part is opened.

The method may further include controlling a rotational speed of the fan according to an opening extent of the opening and closing part after the opening of the opening and closing part.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 1 is a side cross-sectional view illustrating a conventional inverter;

FIG. 2 is a perspective view illustrating an inverter according to an embodiment of the present invention;

FIG. 3 is a side cross-sectional view of FIG. 2;

FIG. 4 is a perspective view illustrating the inverter in which an upper case, a main circuit, and a middle frame are removed according to the embodiment of the present invention;

FIG. 5 is a front view of FIG. 4;

FIG. 6 is a view illustrating the inverter in which elements are modularized according to the embodiment of the present invention;

FIG. 7 is a view illustrating an air flow state when an opening and closing part according to the embodiment of the present invention is closed;

FIG. 8 is a view illustrating an air flow state when the opening and closing part according to the embodiment of the present invention is opened; and FIG. 9 is a flowchart of a control method of the inverter according to the embodiment of the present invention.

DETAILED DESCRIPTION OF EXEMPLARY EMBODIMENTS

Hereinafter, exemplary embodiments of the present invention will be described in detail with reference to the accompanying drawings.

Unless particularly defined, meanings of all terms in the specification are the same as general meanings understood by those skilled in the art, and in a case in which meanings of the terms used in the specification conflict with general meanings of the corresponding terms, the meanings obey definitions used in the specification.

However, the invention, which will be described below, is only for describing embodiments of the present invention, and not for limiting claims of the present invention, and components that are the same are represented by the same reference numerals throughout the specification.

FIG. 1 is a side cross-sectional view illustrating a conventional inverter, FIG. 2 is a perspective view illustrating an inverter according to an embodiment of the present invention, FIG. 3 is a side cross-sectional view of FIG. 2, FIG. 4 is a perspective view illustrating the inverter in which an upper case, a main circuit, and a middle frame are removed according to the embodiment of the present invention, FIG. 5 is a front view of FIG. 4, and FIG. 6 is a view illustrating the inverter in which elements are modularized according to the embodiment of the present invention.

FIG. 7 is a view illustrating an air flow state when an opening and closing part according to the embodiment of the present invention is closed, and FIG. 8 is a view illustrating an air flow state when the opening and closing part according to the embodiment of the present invention is opened.

Referring to FIGS. 2 to 8, an inverter 1 according to the embodiment of the present invention may mainly include a circuit 100, a main housing 200, an auxiliary housing 240, and a driver 300.

The circuit 100 may be mainly divided into a main circuit 110 and an auxiliary circuit 120, and such division may be distinguished depending on whether the main circuit 110 or the auxiliary circuit 120 may be disposed in the auxiliary housing 240 which will be described below.

For example, the main circuit 110 is disposed in an upper case 220 which will be described below. The main circuit 110 may include a switching element, for example, a transistor, a thyristor, a power transistor, or an insulated gate bipolar transistor (IGBT) configured to switch direct current (DC) power into high frequency power.

The auxiliary circuit 120 is an element, which generates relatively low heat and is hardly influenced by foreign materials, and is disposed in the auxiliary housing 240 so as to be exposed at the outside for natural ventilation. For example, the auxiliary circuit 120 may include a differential current relay (DCR) or an electromagnetic compatibility (EMC) filter, and the like.

Meanwhile, a controller 130 may be disposed in the main circuit 110 or the auxiliary circuit 120, and control of the controller 130 will be described below.

The main housing 200 accommodates the main circuit 110, and a first vent hole 231 may be formed in a lower end portion of one side surface of the main housing 200.

Specifically, the main housing 200 may sequentially mainly include a middle frame 210, the upper case 220, and a lower case 230.

The middle frame 210 is substantially formed in a plate shape, and the main circuit 110 is disposed at an upper side of the middle frame 210, and a heat sink 310 is coupled to a lower side of the middle frame 210.

The upper case 220 is a cover disposed above the middle frame 210 and configured to accommodate the main circuit 110. A plurality of upper vent holes 221 for natural heat dissipation may be formed at least one side surface of the upper case 220.

The lower case 230 forms a space in which the heat sink 310 of the driver 300, which will be described below, is accommodated and a fan 320 is disposed. The lower case 230 may be disposed under the middle frame 210.

In addition, the first vent hole 231 may be formed in one side surface of the lower case 230. The first vent hole 231 may be an inlet for external air or outlet for internal air according to normal or reverse rotation of the fan 320.

In addition, in order for air forcibly moved by the fan 320 to flow more smoothly, a plurality of first vent holes 231 may be formed in the one side surface of the lower case 230.

The auxiliary housing 240 is disposed under the lower case 230 and accommodates the auxiliary circuit 120, and a second vent hole 241 may be formed in at least one side surface of the auxiliary housing 240.

In addition, a plurality of second vent holes 241 may be formed in at least one side surface of the auxiliary housing 240. In order to improve natural cooling efficiency, the second vent holes 241 may be formed in all surfaces of the auxiliary housing 240 as illustrated in the drawings.

In addition, although not illustrated, n $n^{th}$ auxiliary housings may be further provided under the auxiliary housing 240, and the $n^{th}$ auxiliary housings may be formed to be the same as the auxiliary housing 240.

In this case, opening and closing parts 330 may be disposed in the $n^{th}$ auxiliary housings so that air may be ultimately forcibly moved by the fan 320.

In addition, the upper vent hole 221, the first vent hole 231, and/or the second vent hole 241 may have a long hole shape perpendicular to the surface of the ground or a rectangular shape of which a long side is parallel to the surface of the ground. Accordingly, the same amount of air may be introduced into and discharged from the same space so that the heat sink 310 or DCR disposed in the auxiliary housing 240 may be effectively cooled.

The driver 300 may include the heat sink 310, the fan 320, the opening and closing part 330, and a temperature sensor 340, and may further include an auxiliary fan 350 which is not shown.

The heat sink 310 may be disposed in the middle frame 210, be accommodated in the lower case 230, and absorb heat generated when the main circuit 110 is driven to dissipate the heat.

The heat sink 310 may roughly include a heat dissipation plate and a plurality of heat dissipation fins disposed on the heat dissipation plate.

In addition, the heat sink 310 may be interposed between the first vent hole 231 formed in the one side surface of the lower case 230 and the fan 320 to effectively dissipate heat with an air flow generated by the fan 320.

The fan 320 is disposed on the other side surface of the lower case 230 facing the first vent hole 231, and two fans 320 may be disposed in parallel as illustrated in the drawings. However, the number of the fans 320 may be easily increased or decreased according to an extent of heat generation of the circuit 100.

In addition, normal or reverse rotation and a rotational speed of the fan 320 may be controlled by the controller 130. Hereinafter, it will be described that the fan 320 rotates such that the first vent hole 231 becomes an inlet through which external air is introduced.

The opening and closing part 330 may be interposed between the main housing 200 and the auxiliary housing 240 and controlled to be opened so that the main housing 200 communicates with the auxiliary housing 240.

Specifically, at least one opening and closing part 330 may be disposed on a bottom surface of the lower case 230 or an upper surface of the auxiliary housing 240. By opening the opening and closing part 330, an inside of the lower case 230 may communicate with an inside of the auxiliary housing 240.

In addition, the opening and closing part 330 may be opened or closed by control of the controller 130, or manually opened or closed.

In addition, the opening and closing part 330 may be interposed between the first vent hole 231 and the heat sink 310 or between the heat sink 310 and the fan 320.

In addition, the opening and closing part 330 may also be disposed on the entire bottom surface of the lower case 230 or the entire upper surface of the auxiliary housing 240.

When the opening and closing part 330 is closed, a driving force of the fan 320 is applied to only the lower case 230, and the auxiliary circuit 120 in the auxiliary housing 240 is cooled using a natural cooling method.

Here, the opening and closing part 330 disposed in the lower case 230 interposed between the fan 320 and the heat sink 310 may be most efficient in terms of a hydromechanical relation with the driving force of the fan 320.

In such a case, the auxiliary circuit 120, for example, the DCR, may be disposed at a location corresponding to the heat sink 310 to more efficiently transmit heat.

The temperature sensor 340 may be disposed in the auxiliary housing 240, measure a temperature of the inside of the auxiliary housing 240, and transmit information on the temperature to the controller 130.

That is, the temperature sensor 340 is disposed to measure an amount of heat generated by the auxiliary circuit 120 in the auxiliary housing 240 so as to open the opening and closing part 330. Accordingly, the temperature sensor 340 may also directly measure a temperature of the auxiliary circuit 120.

In addition, the temperature sensor 340 may be disposed in the upper case 220, measure a temperature of an inside of the upper case 220, and transmit information on the temperature to the controller 130.

That is, the temperature sensor 340 is disposed to measure an amount of heat generated by the main circuit 110 in the upper case 220 so as to open the opening and closing part 330. Accordingly, the temperature sensor 340 may also directly measure a temperature of the main circuit 110.

In addition, the temperature sensor 340 may be disposed at each of the inside of the upper case 220 and the inside of the auxiliary housing 240. Accordingly, the controller 130 receives the temperature of each of the inside of the upper case 220 and the inside of the auxiliary housing 240 from the temperature sensor 340 to selectively open the opening and closing part 330.

In addition, the temperature sensor 340 may be disposed in the lower case 230. The controller 130 may open the opening and closing part 330 when a temperature of the inside of the lower case 230 is a preset temperature or lower.

Meanwhile, although not illustrated, an auxiliary fan 350 may be disposed at one side of the auxiliary housing 240 like the auxiliary fan 350 disposed in the lower case 230. In this case, the opening and closing part 330 is not opened.

FIG. 9 is a flowchart of a control method of the inverter according to the embodiment of the present invention.

A control method of the inverter 1 according to the embodiment of the present invention and control of the controller 130 will be described below with reference to FIG. 9.

When the circuit 100 is driven, heat is inevitably generated by the circuit 100. Although some amount of the heat generated by the main circuit 110 is naturally discharged through the upper vent hole 221 of the upper case 220, most amount of the heat is transmitted to the heat sink 310 disposed under the main circuit 110.

The heat transmitted to the heat sink 310 is dissipated from the lower case 230 by rotation of the fan 320 controlled by the controller 130 (S10).

That is, the heat of the inside of the lower case 230 is dissipated by air forcibly circulated by the fan 320.

In addition, heat may be generated by the auxiliary circuit 120, for example, the DCR disposed in the auxiliary housing 240 according to driving of the auxiliary circuit 120. The heat generated by the auxiliary circuit 120 is naturally dissipated due to the second vent hole 241 formed in the at least one side surface of the auxiliary housing 240.

An air flow in a state in which the opening and closing part 330 is closed is illustrated in FIG. 7. Black arrows denote an air flow in the lower case 230, and gray arrows denote an air flow in the auxiliary housing 240.

Then, the temperature sensor 340 senses a temperature of the inside of the auxiliary housing 240 or a temperature of the auxiliary circuit 120 disposed in the auxiliary housing 240 (S20).

When the measured temperature of the inside of the auxiliary housing 240 is higher than a preset temperature, or the temperature of the auxiliary circuit 120 is higher than the preset temperature, or an output current of the circuit 100 is a preset current value or more (S30), the controller 130 may open the opening and closing part 330 disposed on the bottom surface of the lower case 230 or the upper surface of the auxiliary housing 240 (S40).

The opening and closing part 330 is opened and then an air flow in the inside of the auxiliary housing 240 is affected by air forcibly moved by the fan 320, and thus cooling efficiency of the auxiliary circuit 120 may be improved.

In addition, in order to maintain or increase a flowing force of air in the lower case 230, the controller 130 may control a rotational speed of the fan 320 according to an output current value of the circuit 100 or an opening extent of the opening and closing part 330 (S50).

In addition, the controller 130 may differently control an opening or closing rate of the opening and closing part 330 according to a change in temperature.

For example, the controller 130 starts to open the opening and closing part 330 when the temperature of the inside of the auxiliary housing 240 measured by the temperature sensor 340 is higher than or equal to a first set temperature which is preset. The controller 130 completely opens the opening and closing part 330 in a case in which the temperature of the inside of the auxiliary housing 240 measured by the temperature sensor 340 is higher than or equal to a second set temperature which is preset. The controller 130 may control an opening rate of the opening and closing part 330 according to an increase rate of temperature when the measured temperature ranges from the first set temperature to the second set temperature.

More specifically, in a case in which a temperature of the auxiliary housing 240 is X ° C. which is a preset initial temperature, the controller 130 may open the opening and closing part 330 by only 10%. When the temperature thereof is Y ° C. which is a preset maximum temperature, the controller 130 may open the opening and closing part 330 by 100%. In a case in which the temperature thereof is a middle temperature in the range from X ° C. to Y ° C., the controller 130 may open the opening and closing part 330 by 50%.

In addition, in a case in which a plurality of opening and closing parts 330 are provided, when a temperature is changed as described above, the controller 130 may also control some opening and closing parts 330 to be opened and control the remaining opening and closing parts 330 not to be opened.

In addition, a main heat source is the main circuit 110 disposed in the upper case 220. Accordingly, the controller 130 may close a part or entirety of the opening and closing part 330 in a case in which a temperature of the upper case 220 increases to the preset temperature or higher after the opening and closing part 330 is opened.

In addition, in a case in which a temperature of the lower case 230 is lower than the preset temperature, the controller 130 may open the opening and closing part 330 to naturally cool the lower case 230 like the auxiliary housing 240. In addition, the controller 130 may lightly drive the fan 320 to dissipate heat of the lower case 230 with small movement of air.

An air flow in a state in which the opening and closing part 330 is opened is illustrated in FIG. 8, black arrows denote an air flow in the lower case 230, and gray arrows denote an air flow in the auxiliary housing 240.

After the opening and closing part 330 is opened, the temperature sensor 340 may sense a temperature of the upper case 220 (S60). In a case in which the temperature of the upper case 220 increases to the preset temperature or higher (S70), the controller 130 may close a part or entirety of the opening and closing part 330 to suppress an increase in temperature of the main circuit 110 (S80).

In addition, even when the part or entirety of the opening and closing part 330 is closed, the controller 130 may accordingly control the rotational speed of the fan 320 (S90).

That is, the inverter 1 according to the embodiment of the present invention normally forcibly cools the heat sink 310 disposed in the lower case 230 to dissipate heat of the main circuit 110 using the fan 320. In addition, in the inverter 1, since the auxiliary housing 240 in which the auxiliary circuit 120 is disposed is naturally cooled, cooling efficiency and driving efficiency of the fan 320 are improved.

However, when the temperature of the auxiliary circuit 120 increases, the controller 130 opens the part or entirety of the opening and closing part 330, and increases the rotational speed of the fan 320. Accordingly, since a cooling speed may increase, there is an advantage in that cooling efficiency and economical use of the fan 320 are improved.

In the present invention, first, since an inside of a lower case forming a main space is forcibly cooled by a fan and an inside of an auxiliary housing forming an auxiliary space is naturally cooled, heat of a heat sink can be quickly and economically dissipated. However, when an increase in an output current is detected or an increase in an internal temperature of an upper case, the lower case, or the auxiliary housing is detected, the space of the auxiliary housing is flexibly opened toward the lower case. Accordingly, since the auxiliary circuit is forcibly cooled, heat can be quickly and effectively dissipated.

As described above, the above-described exemplary embodiment of the present invention may be variously changed and modified by those skilled in the art without departing from the technical spirit of the present invention, and the technical scope of the present invention has to be defined not by the description of the embodiments, but by the appended claims and equivalents thereof.

What is claimed is:

1. An inverter comprising:
    a main housing to accommodating a main circuit and including a first vent hole formed in a lower end portion of one side surface thereof;
    a fan disposed on an other side surface of the main housing the first vent hole;
    a heat sink interposed between the first vent hole and the fan;
    an auxiliary housing disposed under the main housing, accommodating an auxiliary circuit, and including a second vent hole formed in at least one of the side surfaces thereof, wherein the auxiliary housing includes a temperature sensor;
    an opening and closing part interposed between the main housing and the auxiliary housing and configured to be opened so that the main housing communicates with the auxiliary housing; and
    a controller disposed in the main circuit or the auxiliary circuit, in communication with the fan, the opening and closing part and the temperature sensor, wherein the controller starts to open the opening and closing part when a temperature inside of the auxiliary housing measured by the temperature sensor is higher than or equal to a first preset temperature, completely opens the opening and closing part when the temperature inside of the auxiliary housing measured by the temperature sensor is higher than or equal to a second preset temperature and controls an opening rate of the opening and closing part according to an increasing rate of temperature in which the temperature inside of the auxiliary housing measured by the temperature sensor ranges from the first preset temperature to the second preset temperature.

2. The inverter of claim 1, wherein the main housing includes:
    a middle frame in which the main circuit is disposed;
    an upper case disposed above the middle frame accommodating the main circuit; and
    a lower case disposed under the middle frame and having the first vent hole formed in a side surface thereof.

3. The inverter of claim 2, wherein:
    a plurality of first vent holes identical to the first vent hole are formed in the one side surface of the lower case; and
    a plurality of second vent holes identical to the second vent hole are formed in the at least one side surface of the auxiliary housing.

4. The inverter of claim 1, wherein the second vent hole is formed in each of the side surfaces of the auxiliary housing.

5. The inverter of claim 1, wherein the fan rotates such that the first vent hole becomes an inlet through which external air is introduced.

6. The inverter of claim 1, wherein the opening and closing part is opened or closed by control of the controller or manually opened or closed.

7. The inverter of claim 1, wherein the main housing includes:
    a middle frame in which the main circuit is disposed;
    an upper case disposed above the middle frame, configured to accommodate the main circuit, and including a second temperature sensor configured to operate in conjunction with the controller; and
    a lower case disposed under the middle frame and having the first vent hole formed in a side surface thereof,
    wherein the controller closes the opening and closing part when a temperature of an inside of the upper case measured by the second temperature sensor is a third preset temperature.

8. The inverter of claim 1, wherein the main housing includes:
    a middle frame in which the main circuit is disposed;
    an upper case disposed above the middle frame and configured to accommodate the main circuit; and
    a lower case having the first vent hole formed in a side surface thereof, disposed under the middle frame, and including a second temperature sensor configured to operate in conjunction with the controller,
    wherein the controller opens the opening and closing part when a temperature of an inside of the lower case measured by the second temperature sensor is a third preset temperature or lower.

9. The inverter of claim 1, wherein the opening and closing part is interposed between the first vent hole and the heat sink or between the heat sink and the fan.

10. The inverter of claim 9, wherein a differential current relay (DCR) is disposed at a location, which corresponds to the heat sink, in the auxiliary housing.

11. The inverter of claim 1, wherein the controller opens the opening and closing part when an output current of each of the main circuit and the auxiliary circuit is a preset current value or more.

12. The inverter of claim 1, wherein the controller controls a rotational speed of the fan according to an output current value of each of the main circuit and the auxiliary circuit or an opening extent of the opening and closing part.

* * * * *